United States Patent [19]

van Roermund

[11] Patent Number: 4,716,375
[45] Date of Patent: Dec. 29, 1987

[54] SWITCHED-CAPACITOR MULTIPLIER CIRCUIT

[75] Inventor: Arthur H. M. van Roermund, Eindhoven, Netherlands

[73] Assignee: U.S. Philips Corporation, New York, N.Y.

[21] Appl. No.: 878,940

[22] Filed: Jun. 26, 1986

[30] Foreign Application Priority Data

Jul. 18, 1985 [NL] Netherlands ............... 8502071

[51] Int. Cl.$^4$ ............... H03D 3/18; H03K 5/00; H03K 17/00
[52] U.S. Cl. ............... 329/50; 329/110; 331/25; 328/151; 328/160; 455/323
[58] Field of Search ........ 329/50, 109, 110, 153, 329/154; 331/14, 17, 25, 32; 332/31 R; 328/151, 160; 333/173; 455/214, 323, 337; 375/94, 119, 120

[56] References Cited

U.S. PATENT DOCUMENTS

| | | | |
|---|---|---|---|
| 4,439,693 | 3/1984 | Lucas et al. | 333/173 X |
| 4,517,655 | 5/1985 | Claasen et al. | 364/703 |
| 4,531,106 | 7/1985 | Ganesan | 328/151 X |
| 4,569,072 | 2/1986 | Claasen et al. | 381/7 |
| 4,616,185 | 10/1986 | van Roermund | 328/160 |
| 4,616,192 | 10/1986 | van Roermund | 331/25 X |

FOREIGN PATENT DOCUMENTS

0077091 4/1983 European Pat. Off. .
0132885 2/1985 European Pat. Off. .
0162496 11/1985 European Pat. Off. .

*Primary Examiner*—Eugene R. LaRoche
*Assistant Examiner*—David Mis
*Attorney, Agent, or Firm*—Thomas A. Briody; William J. Streeter; Marianne R. Rich

[57] ABSTRACT

A switched-capacitor multiplier circuit for multiplying an information signal x(t) by a bipolar carrier signal d(t) consisting of a distributed multiplier circuit with which the bipolar carrier signal is normally associated. To reduce offset voltages in the output signal caused by the operational amplifiers used and caused as a result of clock feed-through, it is not the bipolar carrier signal itself, but a full-wave rectified version thereof that is associated with the distributed multiplier circuit. The output signal of the multiplier circuit is applied to an auxiliary multiplier circuit multiplying it by $+1$ or $-1$ dependent on the instantaneous polarity of the bipolar carrier signal d(t). The offset voltage is thereby transposed to a frequency which is at least equal to the fundamental frequency of the carrier signal so that, if desired, it can be suppressed with the aid of a suitably chosen low-pass filter without the desired signal being affected thereby.

4 Claims, 10 Drawing Figures

A

B

SWITCHED-CAPACITOR MULTIPLIER CIRCUIT

BACKGROUND OF THE INVENTION

(1) Field of the Invention

The invention relates to a switched-capacitor multiplier circuit for multiplying an information signal x(t) by a periodical bipolar carrier signal d(t). A multiplier circuit of this type can be used, for example, as an amplitude demodulator in a stereodecoder (see, for example, reference 1), but also as a phase detector in a phase-locked loop (see, for example, reference 3).

(2) Description of the Prior Art

Multiplier circuits of this type have extensively been described in, for example, references 1, 2 and 3. They generally comprise a distributed multiplier circuit and a control pulse circuit. The latter supplies control pulses at a rate of, for example, $f_s$. The distributed multiplier circuit is formed by a plurality of signal channels each receiving the information signal x(t) and being provided with a cascade arrangement of a switching circuit and a weighting network having a given positive or negative weighting factor. These switching circuits are controlled in a predetermined sequence by the sequence of control pulses so that at least during a given period (for example, the duration of a control pulse) the information signal is applied to the weighting network. In this manner each signal channel supplies an output signal and all these output signals are summed in an adder.

The required weighting factors are obtained by sampling the carrier signal d(t) with the previously mentioned frequency $f_s$ which is to be chosen in such a manner that a series of N periodically recurring carrier signal samples $d_1, d_2, d_3, \ldots, d_N$ is obtained. The number of signal channels (including those having a weighting factor which is possibly equal to zero) is then in principle taken to be equal to N. When the k-th carrier signal sample is indicated by $d_k$ (where k=1, 2, 3, ..., N) the weighting factor in the k-th signal channel is equal to $d_k$.

Since this multiplier circuit is of the switched-capacitor type, each weighting network includes a capacitor, and the adder is constituted by an operational amplifier bridged by a capacitor having a capacitance C. The capacitance of the capacitor in the k-th signal channel will be indicated by C(k) for which principally applies that:

$$C(k) = |d_k| \cdot C$$

where $|d_k|$ represents the magnitude of the carrier signal sample $d_k$.

If the series of carrier signal samples consists exclusively of positive carrier signal samples (definitely positive), the implementation of the multiplier circuit follows directly from the foregoing. However, if several carrier signal samples from the series are negative, so that also negative weighting factors are to to realized, a number of further steps will have to be taken. The simplest step is the one in which the information signal is applied via a polarity inverter circuit to the switching circuit in each signal channel in which a negative weighting factor is to be realised (see, for example, FIG. 6 in reference 3). A further possibility is to provide the distributed multiplier circuit with a chopper circuit through which the information signal is applied to the signal channels. This chopper circuit applies the information signal in an unchanged form to the signal channels if the instantaneous value of the information signal is to be multiplied by a positive carrier signal sample. If this multiplication is, however, to be effected with a negative carrier signal sample, the information signal is inverted in polarity by the chopper circuit. Characteristic of all the above-mentioned cases is that a product signal is obtained at the output of the adder which signal is equal to the product of the information signal x(t) and the periodical bipolar carrier signal d(t). It appears from the foregoing that the carrier signal d(t) is not present in an explicitly time-continuous form. This will hereinafter become manifest by the phase "a given multiplier sigal is associated with the distributed multiplier circuit"; the carrier signal d(t) in the cases described hereinbefore.

The switched-capacitor multiplier circuits formed in this manner frequently exhibit an unwanted offset voltage at the output of the adder, which voltage is generated by the distributed multiplier circuit itself. It is generally built up of two components. The first component is supplied by the operational amplifier in the adder; the op-amp offset. The second component is supplied by the switching circuits, more particularly by the parasitic capacitances in these switching circuits and is generally referred to as clock feed-through. Both components arise independently of each other, but they are often inadmissibly high. When using this multiplier circuit in, for example, a stereodecoder circuit, this offset voltage should be less than 2 mV to achieve a channel separation of more than 50 dB. It is found that this cannot be realised in practice without special steps.

OBJECT AND SUMMARY OF THE INVENTION

It is an object of the invention to considerably reduce the said offset voltage in a simple manner in a switched-capacitor multiplier circuit as described above and in which an information signal x(t) is multiplied by a periodical bipolar carrier signal d(t).

According to the invention the multiplier signal associated with the distributed multiplier circuit is a full-wave rectified version of the said bipolar carrier signal, an auxiliary multiplier circuit being connected exclusively to the output of the distributed multiplier circuit for multiplying the output signal of the distributed multiplier circuit by a first factor during the positive period of the carrier signal and by a second factor during the negative period of the carrier signal, said factors having opposed polarities.

REFERENCES

1. Multiplier circuit for stereodecoders; Netherlands patent application No. 8104668 (PHN. 10.168), particularly FIGS. 18 and 19; this application is equivalent to EP application No. 0077091-A1.
2. Multiplier circuit having switched-capacitor circuits Netherlands patent application No. 8302591 (PHN. 10.740), particularly FIG. 5; this application is equivalent to EP application No. 0132885-A1.
3. Phase-locked loop with switchable phase detector, Netherlands patent application No. 8401277 (PHN. 11.010), particularly FIGS. 6 and 7; this application is equivalent to EP application No. 0162496-A1.

DESCRIPTION OF THE EMBODIMENTS

Figure 1:
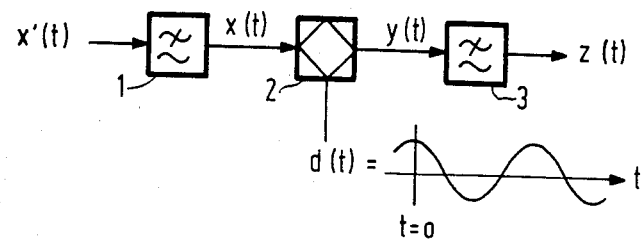
FIG. 1 schematically shows the general build-up of a phase detector for use in a phase-locked loop.

In this section an embodiment will be described of a multiplier circuit for use in a phase detector for a phase-locked loop. As is shown in FIG. 1, such a phase-detector generally comprises a pre-modulation filter 1, a multiplier circuit 2 and possibly a post-modulation filter 3. A received signal x'(t) is applied to the pre-modulation filter 1 and is converted by this filter into a desired information signal x(t), for example, a band-limited signal having a pilot signal. In the multiplier circuit 2 x(t) is multiplied by the one or the other bipolar carrier signal d(t) so that a product signal y(t) is obtained. In the post-modulation filter unwanted frequency components are removed from y(t) so that the "pure" product signal z(t) is obtained.

Figure 2:
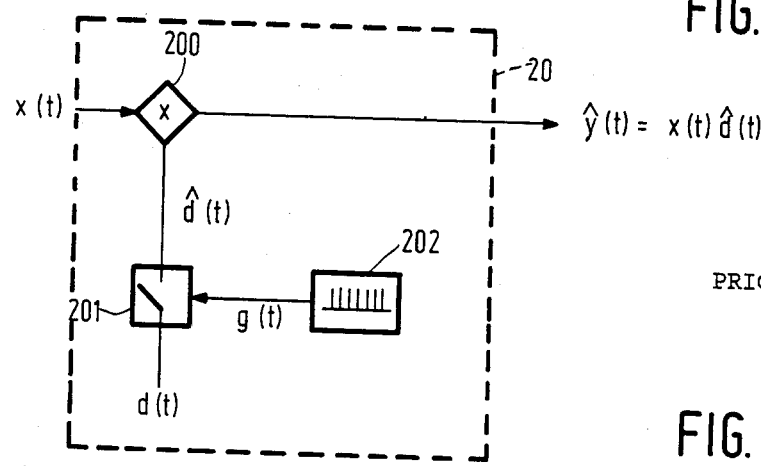
FIG. 2 schematically shows the general build-up of the multiplier circuit for use in the phase detector of FIG. 1.

The multiplier circuit 2 comprises a distributed multiplier circuit 20 whose construction is shown schematically in FIG. 2. The carrier signal d(t) is assumed to be applied to a multiplier 200 through a sampling device 201 controlled by sampling pulses g(t) which are supplied at a rate of $f_s$ by a clock pulse generator 202. Let us assume that the carrier signal d(t), which is a periodical signal, has the shape as shown at A in FIG. 3 and that the sampling pulses g(t) occur at the instants $t = t_o + nT$ as is shown at B in FIG. 3. In this case $t_o$ is a constant, $T = 1/f_s$ and n is an integer between $-\sim$ and $+\sim$ having the number of the sampling pulse. The sampling device 201 then supplies the signal $\tilde{d}(t)$ which is shown at C in FIG. 3 and for which it holds that:

$$\tilde{d}(t) = \overset{\sim}{\underset{n=-\sim}{\Sigma}} d(t)\delta(t - t_o - nT)$$

In this equation $\delta(t)$ represents the delta function. The values assumed by $\tilde{d}(t)$ at the instants $t_o + nT$ are referred to as carrier signal samples and will be denoted by $d_n$ so that it holds that:

$$d_n = d(t_o + nT)$$

The sampling frequency $f_s$ is then chosen to be such that the series of carrier signal samples $d_n$ is periodical and that each period comprises N such carrier signal samples, so that $$d_{n+N} = d_n.$$

Figure 3:
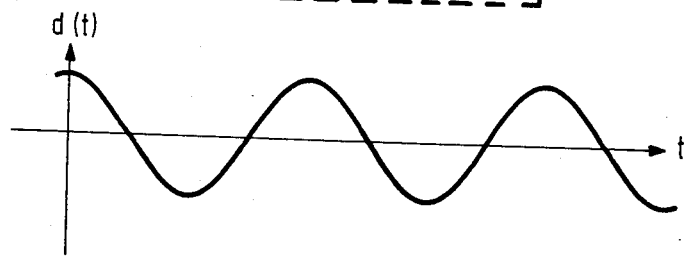
FIG. 3 shows some time diagrams to explain the operation of the multiplier circuit shown in FIG. 2.
Figure 3:
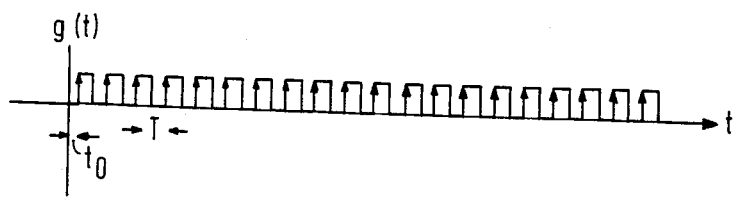
Figure 3:
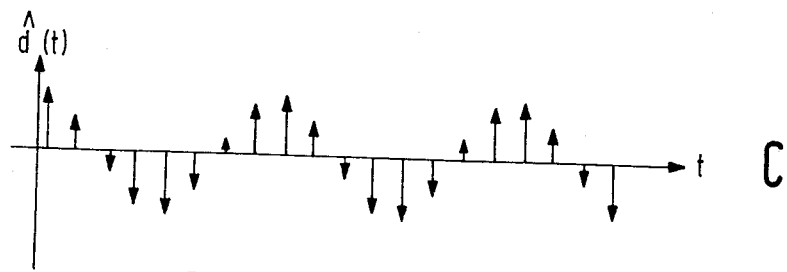
Figure 4:
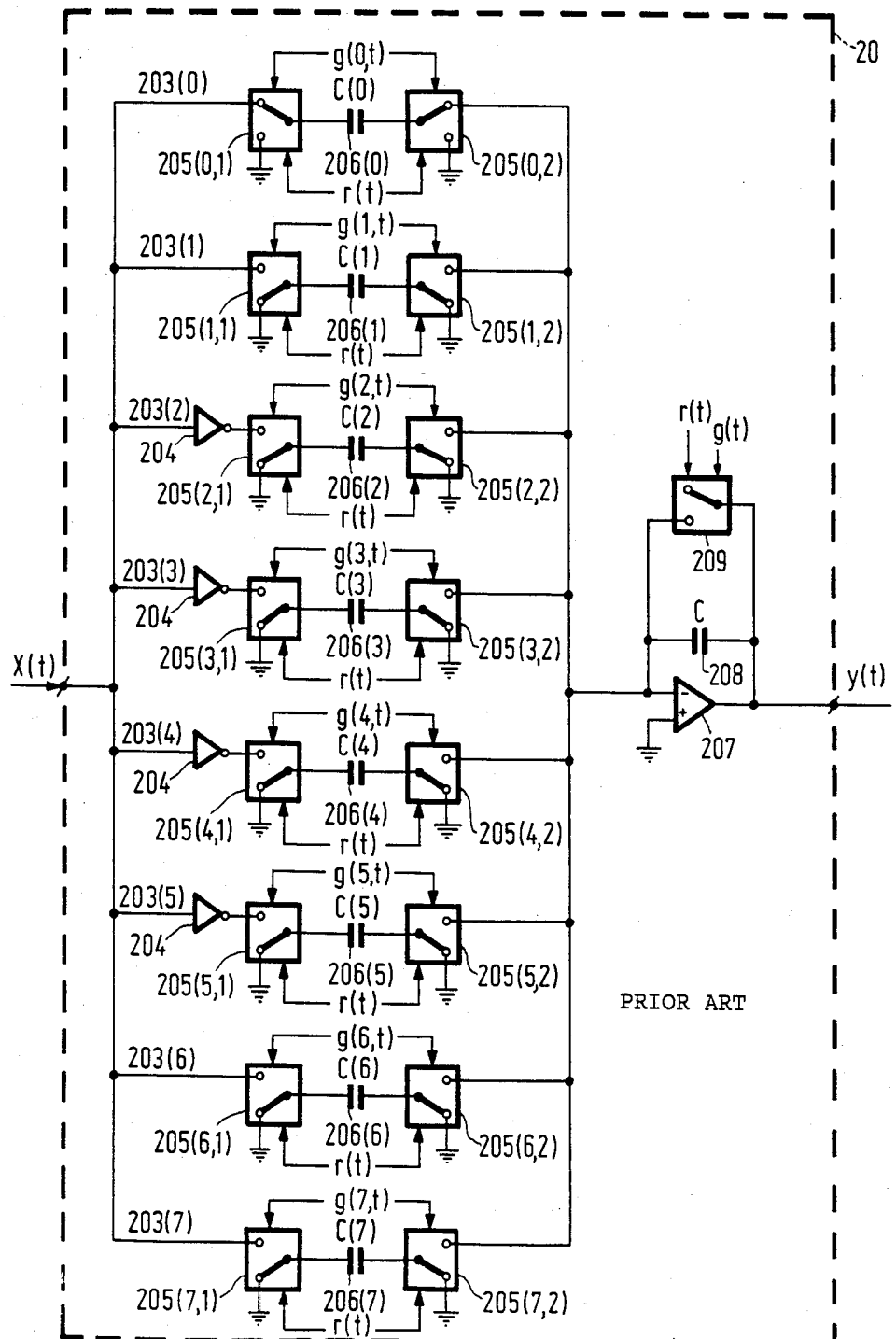
FIG. 4 shows a known practical embodiment of this multiplier circuit, namely of the switched capacitor type.

Practical embodiments of a distributed multiplier circuit of this type have been described in the references 1 and 3 and for completeness' sake one is shown in FIG. 1 and 3 and for completeness' sake one is shown in FIG. 4 where N is chosen to be 8. This distributed multiplier circuit 20 comprises 8 signal channels 203 (.) in which the information signal is multiplied by the respective carrier signal samples $d_0, \ldots d_7$. Each signal channel comprises a switching circuit consisting of two switches 205(., 1) and 205(., 2). A capacitor 206(.) having a capacitance C(.) is provided in between them. Together with the two switches this capacitor constitutes a switched capacitor. All signal channels are connected to the input of an operational amplifier 207 which is bridged by a parallel arrangement of a capacitor 208 having a capacitance C and a switching circuit 209. The switching circuits 205(., 1) and 205(., 2) are controlled by control pulses g(., t) and r(t), whilst the switching circuit 209 is controlled by control pulses g(t) and r(t). More particularly, the relative switching circuits 205(k, 1) and 205(k, 2) become conducting by the occurrence of a control pulse g(k, t) in the K-th signal channel, so that the associated capacitor 206(k) is charged to a voltage which is equal to the value x[g(k, t)] which has the information signal x(t) at the instant when this control pulse g(k, t) occurs. Since this capacitor 206(k) is in series with capacitor 208, the operational amplifier supplies an output voltage of the magnitude $$-\frac{C(k)}{C} x[g(k, t)]$$

when switching circuit 209 is open. After occurrence of the control pulse g(k, i) and the coinciding control pulse g(t) and prior to a control pulse g(k+1, t) being applied to the k+1-signal channel, a reset pulse r(t) occurs so that both capacitor 206(k) and capacitor 208 are discharged. The quotient C(k)/C represents a weighting factor which is characteristic of the relevant signal channel, which factor should be equal to the signal sample $d_k$. In any case this quotient is equal to the magnitude $|d_k|$ of the signal sample $d_k$ because the capacitances can only be positive. Special steps will have to be taken if a negative weighting factor is to be realised in given signal channels. In the embodiment shown, the information signal x(t) is to this end applied via a polarity inverter stage 204 to these signal channels.

Figure 5:
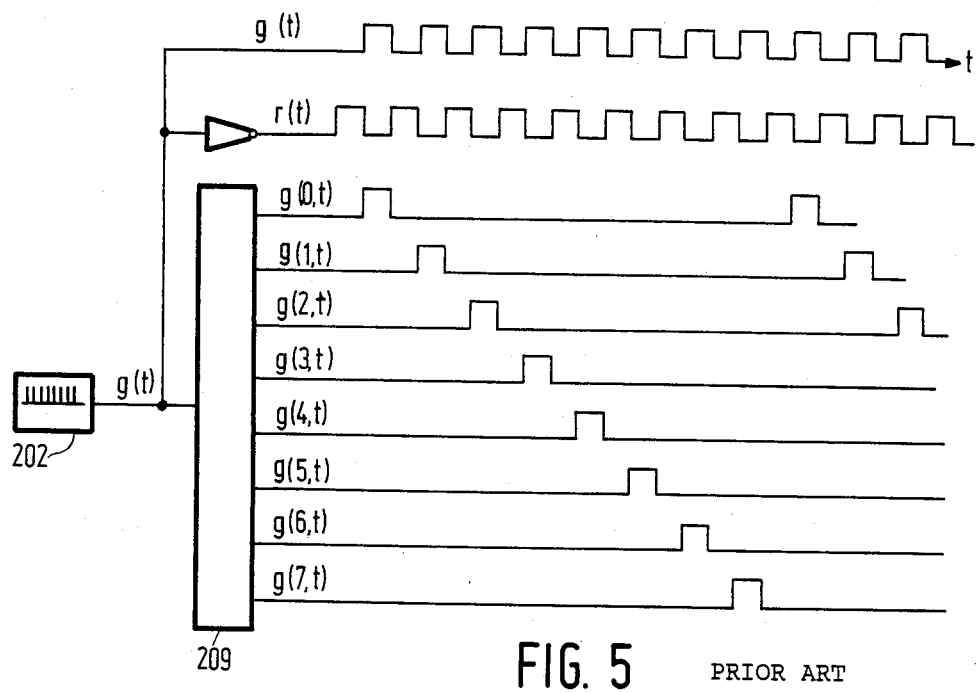
FIG. 5 shows a control generator for generating the various series of control pulses which are required in the multiplier circuit shown in FIG. 4.

It is to be noted that the said control pulses g(., t) can be derived in known manner (see, for example, reference 2) from the clockpulse generator 202. For completeness' sake FIG. 5 shows this once again. A pulse divider circuit 210 is used there.

Since in this embodiment both positive and negative weighting factors are realised, a bipolar carrier signal is associated with this distributed multiplier circuit which thus supplies the desired output signal y(t).

As already stated, the output signal y(t) of the distributed multiplier circuit 20 shown in FIG. 4 is adversely affected by the offset voltage which is introduced by the operational amplifier on the one hand, and by the clock feedthrough of the switching circuits 205(., 1) and 205(., 2) on the other hand.

Figure 6:
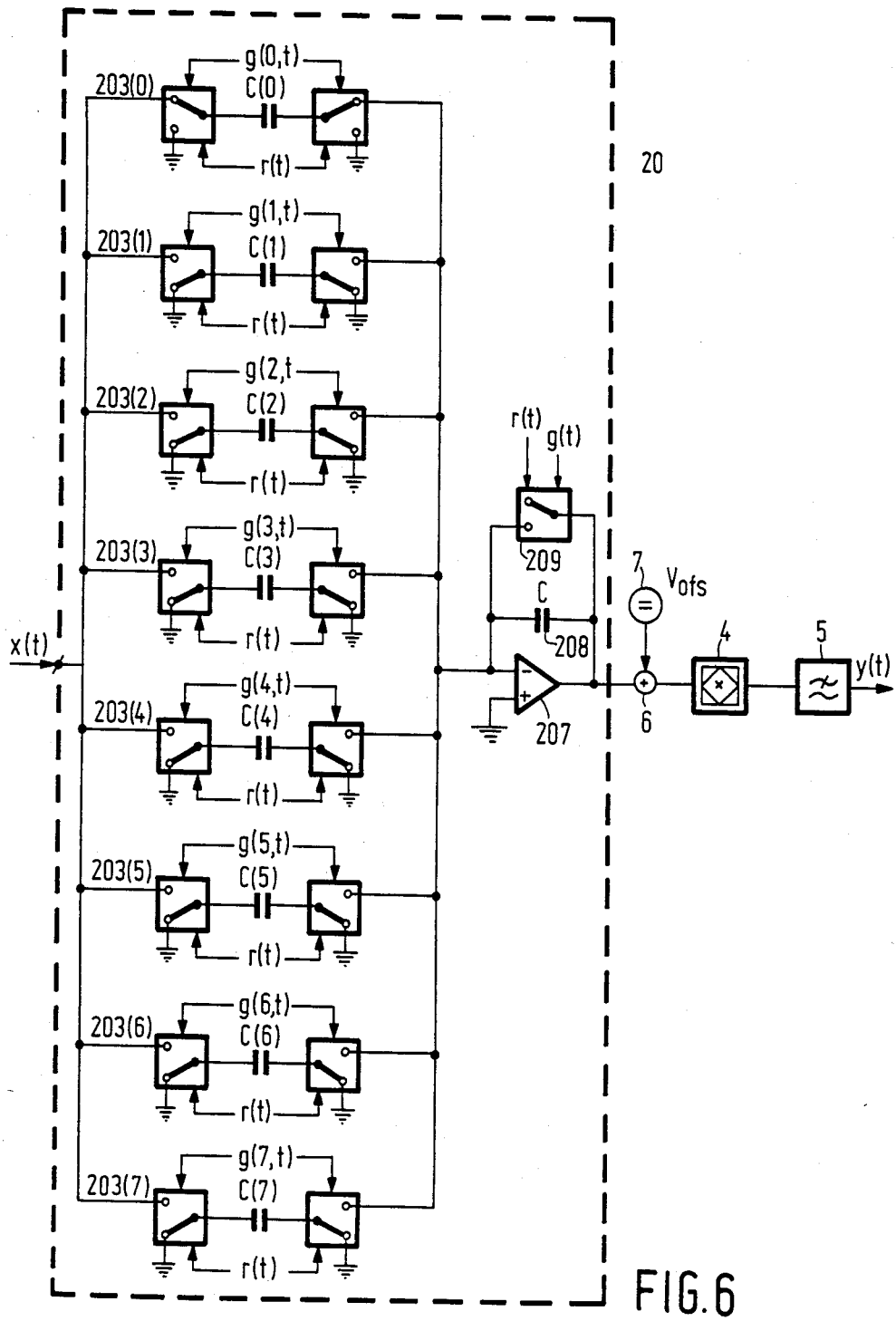
FIG. 6 shows the multiplier circuit according to the invention.

An embodiment of a switched capacitor multiplier in which the influence of these offset voltages is eliminated to a great extent is shown in FIG. 6. The multiplier circuit shown in this Figure is distinguished from the one shown in FIG. 4 in that the polarity inverter circuits 204, through which the signal x(t) in the embodiment shown in FIG. 4 has applied to the signal channels in which a negative weighting factor was to be realised, has now been replaced by an auxiliary multiplier circuit 4 connected to the output of the operational amplifier 207. It multiplies the output signal of the distributed multiplier circuit by a first factor, for example, by +1 as long as the carrier signal d(t) is positive, and by a second factor, for example, −1 as long as the carrier signal d(t) is negative. In this embodiment the output of this auxiliary multiplier circuit is connected to a low-pass filter 5 whose cut-off frequency is lower than the fundamental frequency of the carrier signal d(t).

Figure 7:
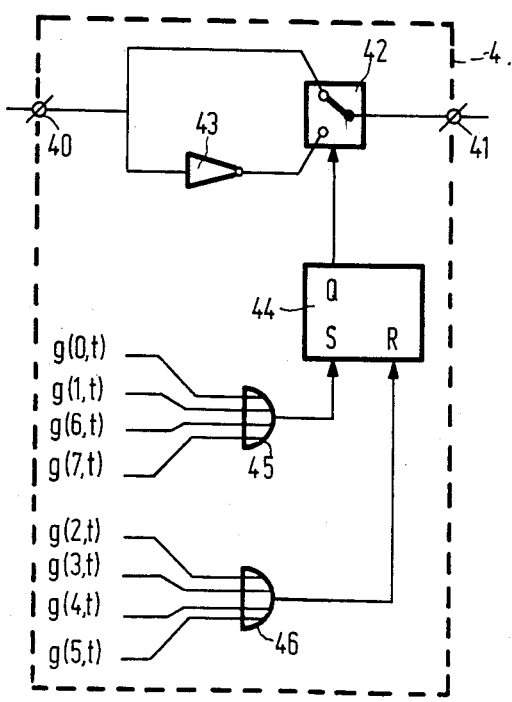
FIG. 7 shows an embodiment of the auxiliary multiplier circuit as used in FIG. 6.

A practical embodiment of this auxiliary multiplier circuit is shown in FIG. 7. It has an input 40 and an output 41. By means of a switch 42, which is only symbolically shown in the Figure, the output 41 can be connected to the input 40 either directly or through a polarity inverter amplifier 43. The position of switch 42 is changed after each half period of the carrier signal d(t). To this end this switch 42 is controlled by the output signal of an R-S-flip-flop 44 whose S-input receives the series of control pulses g(0, t), g(1, t), g(6, t), g(7, t) via an OR-gate 45. The R-input receives the other series of control pulses g(2, t), g(3, t), g(4, t), g(5, t) via an OR-gate 46.

Since the distributed multiplier circuit 20 does not include a polarity inverter circuit and the weighting factor C(k)/C in the k-th signal channel is equal to $|d_k|$, a carrier signal is associated with this distributed multiplier circuit, which signal is a full-wave rectified version of the original bipolar carrier signal d(t).

The function of the polarity inverter circuits 204 of FIG. 4 is carried out by the auxiliary multiplier circuit 4 shown in FIG. 6. This may be evident as follows. The carrier signal d(t) can be written as:

$$d(t) = |d(t)| \text{ sign } \{d(t)\}, \quad (1)$$

$$\text{sign } \{d(t)\} = +1 \text{ when } d(t) > 0 \quad (2)$$

$$= -1 \text{ when } d(t) \leq 0$$

so that in accordance with FIG. 1 it holds that $$y(t) = x(t) \cdot d(t) = x(t)|d(t)| \text{ sign } \{d(t)\} \quad (3)$$

and in accordance with FIG. 2:

$$\hat{y}(t) = x(t) \cdot \hat{d}(t) = x(t)|\hat{d}(t)| \text{ sign } \{d(t)\} \quad (4)$$

Figure 8:
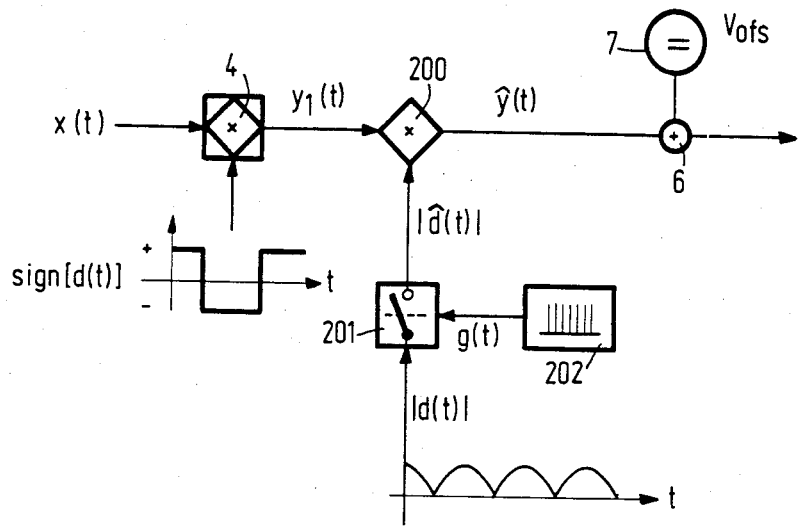
FIGS. 8 and 9 show some theoretical diagrams to explain the operation of the multiplier circuit according to the invention and FIG. 10 shows some frequency spectra for the same purpose.

Since in the embodiment of FIG. 4 one of the switching circuits in the signal channels 203(0), 203(1), 203(6), 203(7) is conducting when d(t)>0 and one of the switching circuits 203(2)–203(5) is conducting when d(t)≦0, it can be said that x(t) is multiplied by sign {d(t)}=+1 when d(t)>0 and subsequently by the relevant $|d(t)|$ and by sign {d(t)}=−1 when d(t)≦0. In short, the operation of this embodiment may be interpreted as is schematically shown in FIG. 8. That is to say, firstly x(t) is multiplied by the signal sign {d(t)}. This results in the signal y(t)=x(t) sign {d(t)} which in turn is multiplied by the sampled version $|d(\hat{t})|$ of the signal $|d(t)|$ so that the output signal $\hat{y}(t)$ is indeed defined by equation (4).

In the embodiment shown in FIG. 6 the information signal x(t) is first multiplied by the sampled version $|d(\hat{t})|$ of $|d(t)|$ so that the product signal $\hat{y}_2(t) = x(t)|\hat{d}(t)|$ is obtained. In its turn this product signal is multiplied in the auxiliary multiplier circuit 4 by sign {d(t)} so that again the desired product signal $\hat{y}(t)$ is obtained. This situation is also schematically shown in FIG. 9.

Figure 9:
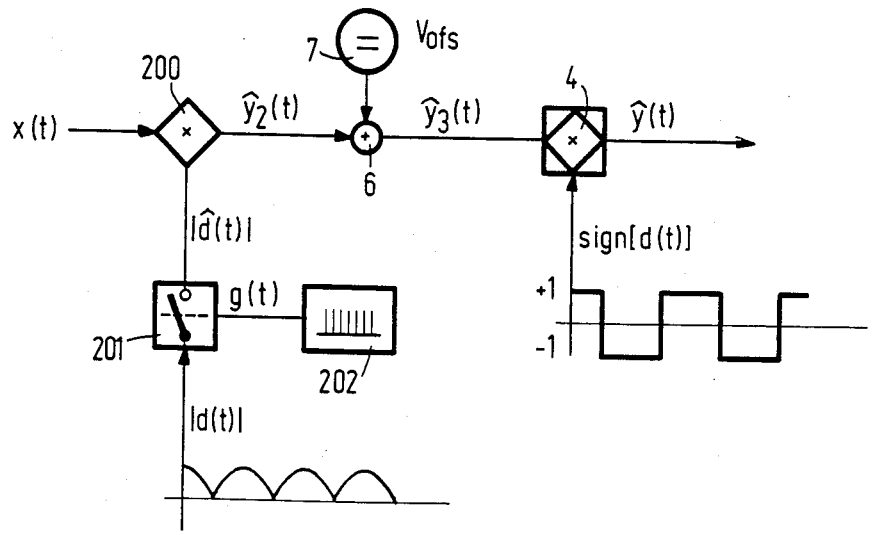

The offset voltage which is introduced by the distributed multiplier circuit itself may be considered as a DC voltage which is supplied by a DC voltage source and is added to the output signal of the operational amplifier 207. FIGS. 6, 8 and 9 show this situation schematically by means of the adder 6 and the DC voltage source 7.

Figure 10:
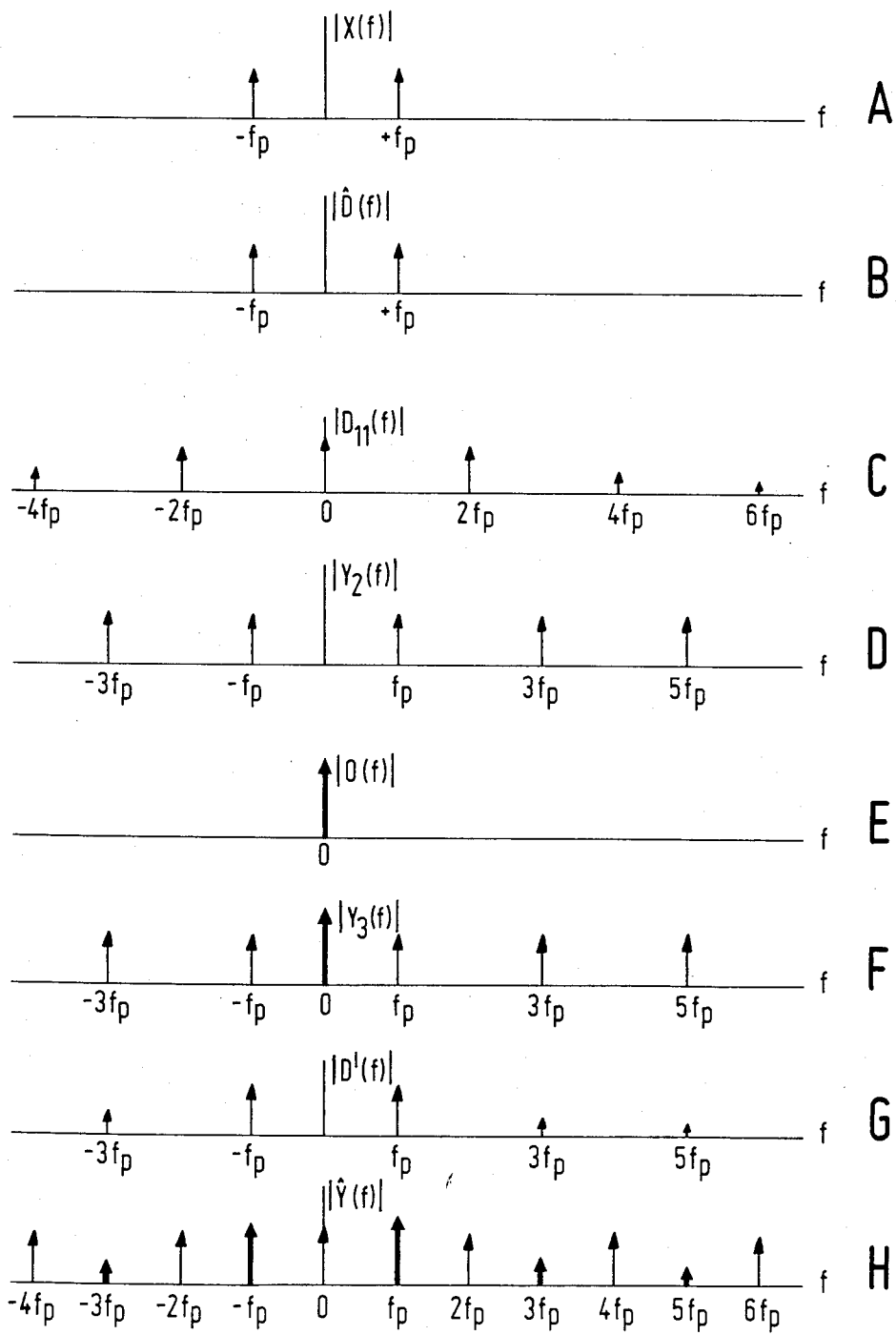

With reference to the frequency diagrams of FIG. 10 it will now be further described how this offset voltage can be eliminated without the desired signal being affected by using the auxiliary multiplier circuit 4. (In this Figure the amplitude relation between the different spectra is not shown for simplicity's sake, as it is irrelevant in this case). The starting situation is the use of the multiplier circuit in a phase detector supplying a DC voltage output signal whose magnitude is dependent on the phase difference between x(t) and d(t) whilst x(t) and d(t) have the same frequency. Let us assume that there applies: $x(t) = \cos(2\pi f_p t + \phi_1)$. The amplitude spectrum $|X(f)|$ of this signal is schematically shown at A in FIG. 10. Let us further assume that $d(t) = \cos(2\pi f_p t + \phi_2)$ and consequently $$d(t) = \sum_{n=-\infty}^{\infty} \cos\{2\pi f_p(t_o + nT) + \phi_2\}\delta(t - t_o - nT).$$

The amplitude spectrum $|D(f)|$ of this signal is shown at B in FIG. 10. Since instead of the signal $\hat{d}(t)$ a full-wave rectified version thereof is used with the distributed multiplier circuit 20, x(t) is multiplied by a signal $|\hat{d}(t)|$ which is built up from a superimposition of a plurality of auxiliary signals whose frequencies are equal to $q2\pi 2f_p$ where q=0, 1, 2, .... The frequency $f_p$ is referred to as the fundamental frequency. The amplitude spectra $|D_{11}(f)|$ associated with the first three auxiliary signals are schematically shown at C in FIG. 10. By multiplication of the signal x(t) by the signal $|\hat{d}(t)|$, the signal $\hat{y}_2(t)$ is obtained whose amplitude frequency spectrum $|Y_2(f)|$ is schematically shown at D in FIG. 10. The offset signal having the amplitude spectrum $|O(f)|$ shown at E in FIG. 10 is then added to this signal, so that the signal $\hat{y}_3(t)$ is obtained with the amplitude spectrum $|Y_3(f)|$ shown at F in FIG. 10. In the auxiliary multiplier circuit $\hat{Y}_3(t)$ is multiplied by sign {d(t)} which is a square-wave signal and may be considered to consist of a superimposition of infinitely many frequency components having the frequencies $(2n+1)1\pi f_p$, said components decreasing in amplitude, The amplitude spectra $|D'(f)|$ associated with the first three frequency components are shown at G in FIG. 10. The output signal $\hat{y}(t)$ of this auxiliary multiplier then has the frequency spectrum $|\hat{Y}(f)|$ shown at H in FIG. 10. With the aid of a low-pass filter whose cut-off frequency is lower than $f_p$ all frequency components which are above this cut-off frequency can be suppressed, if desired, and thus also frequency components resulting from the offset voltage transposed to a higher frequency.

What is claimed is:

1. A switched-capacitor distributed multiplier circuit for multiplying an information signal x(t) by a multiplier signal constituted by a periodical bipolar carrier signal d(t), comprising:

means for rectifying said bipolar carrier signal, thereby creating a rectified carrier signal;

means for applying said rectified carrier signal to said multiplier circuit to constitute said multiplier signal; and auxiliary multiplier circuit means connected exclusively to the output of said multiplier circuit for multiplying the output signal of said distributed multiplier circuit by a binary signal having a value indicative of the instantaneous polarity of said bipolar carrier signal.

2. A multiplier circuit as set forth in claim 1, wherein said rectifying means is a full wave rectifier.

3. A multiplier circuit as set forth in claim 1, wherein said auxiliary multiplier circuit comprises inverter means for inverting said output signal of said distributed multiplier circuit, switch means for disconnecting said inverter means from said distributed multiplier circuit in response to a switch control signal, and logic circuit means for furnishing said switch control signal when said instantaneous polarity of said bipolar carrier signal is a predetermined polarity.

4. A multiplier circuit as set forth in claim 3, wherein said logic circuit means comprises bistable circuit means having a set and reset input and furnishing said switch control signal in response to a signal at said set input, first gating means for furnishing said set signal in response to bipolar carrier signal samples having a negative polarity, and second gating means connected to said reset input for furnishing a reset signal when said instantaneous polarity of said bipolar carrier signal is positive.

* * * * *